United States Patent [19]
Sim

[11] Patent Number: 5,686,735
[45] Date of Patent: Nov. 11, 1997

[54] SILICON-ON-INSULATOR (SOI) TRANSISTOR

[75] Inventor: Jai-hoon Sim, Kwacheon, Rep. of Korea

[73] Assignee: Samsung Electronics Co., Ltd., Suwon, Rep. of Korea

[21] Appl. No.: 390,357

[22] Filed: Feb. 17, 1995

[30] Foreign Application Priority Data

Jun. 13, 1994 [KR] Rep. of Korea ............ 94-13258

[51] Int. Cl.⁶ ..................................... H01L 27/12
[52] U.S. Cl. .................. 257/24; 257/192; 257/347; 257/616
[58] Field of Search ........................ 257/19, 20, 24, 257/190, 27, 192, 347, 365, 66, 616

[56] References Cited

U.S. PATENT DOCUMENTS 5,166,084  11/1992  Pfiester ...................... 437/40
5,420,055  5/1995   Vu et al. .................... 437/40
5,461,250  10/1995  Burghartz et al. ............. 257/66
5,475,244  12/1995  Koizumi et al. .............. 257/192

FOREIGN PATENT DOCUMENTS 0 380 077  8/1990  European Pat. Off. ............ 257/190

OTHER PUBLICATIONS

Nayak et al., "High–Mobility GeSi PMOS on SIMOX," *IEEE Electron Device Letters*, vol. 14, No. 11, Nov. 1993, pp. 520–522.

*Primary Examiner*—Donald Monin
*Attorney, Agent, or Firm*—Cushman Darby & Cushman, IP Group of Pillsbury Madison & Sutro LLP

[57] ABSTRACT

An SOI transistor whose source region and/or drain region have a heterostructure made up of at least two different semiconductor materials, to thereby prevent a bipolar-induced breakdown.

2 Claims, 4 Drawing Sheets

SILICON-ON-INSULATOR (SOI) TRANSISTOR

BACKGROUND OF THE INVENTION

The present invention relates to a silicon-on-insulator (SOI) transistor, and more particularly, to an SOI transistor that can eliminate a bipolar-induced breakdown.

SOI techniques are used for efficiently separating semiconductor devices formed on a silicon substrate, and provide stronger resistance against light and high voltage than a junction isolation technique. In general, the transistor formed on an SOI layer requires less processing than that formed on bulk silicon. In addition, a capacitive coupling between transistors of integrated circuitry is decreased. Such a transistor is called an "SOI" transistor, which has a large threshold slope in addition to the above-described characteristics and very little degradation of the characteristics even at voltages as low as 2V. Further, such a transistor can be produced in a complicated structure where a device degradation is rare, to thereby anticipate a high yield.

FIG. 1 is a section view showing a conventional SOI transistor. FIG. 2 is a schematic view showing source, drain and channel regions of the SOI transistor shown in FIG. 1.

Referring to FIG. 1 and FIG. 2, a buried insulating layer 12, for example, an oxide layer, is formed on a silicon substrate 10 to a thickness of approximately 3,000 Å or above, and a silicon layer having a thickness of approximately 1,000 Å is formed thereon. An impurity is selectively injected into the silicon layer, thereby forming a source region 18, a drain region 20 and a channel region 22. Here, the silicon layer is formed sufficiently shallow. Thus, a transistor having a channel region which is completely depleted is formed. A gate 16 of the transistor is formed by posing a gate oxide film 14 on channel region 22. Reference numeral 30 denotes a substrate electrode.

The SOI transistor operates as follows.

When a voltage higher than that applied to a source electrode 26 is applied to a drain electrode 28, an electric field at a channel direction becomes remarkably large around drain region 20 (marked as "X" in FIG. 2). Therefore, an electron (e) that flows from source electrode 26 toward drain region 20 via source region 18 and channel region 22 is accelerated by the strong electric field. Thus, the electron can easily reach a high energy state. Electrons at such a high energy state collide with a silicon lattice around drain region 20. As a result, a large amount of electron-hole (h) pairs are generated in avalanche. Among the electron-hole pairs generated by impact ionization, the electrons are introduced to drain region 20 by being induced by a high drain electric field and constitute part of the drain current. On the contrary, the holes are not introduced into drain region 20 due to a high electric potential barrier, and accumulate into a channel area 22 around the source. In addition, the accumulated holes cannot surmount an electric potential barrier formed between source region 18 and channel region 22, and thus are accumulated into channel region 22. Then, the depletion region between channel region 22 and drain region 20 becomes a neutral region by the accumulated hole (h). The thus-formed neutral region serves as a base of a bipolar transistor. Accordingly, the accumulated hole operates as a base current of the bipolar transistor, to thereby induce more electrons from source region 18 into channel region 22. The electrons are accelerated by a strong electric field around drain region 20. Thus, more electron-hole pairs are generated by impact ionization and holes are accumulated even more into channel region 22. The hole current caused by the accumulated holes brings about a forward feedback for further increasing the amount of electrons injected from source region 18. Thus, a breakdown between source 18 and drain 20 is caused. The bipolar-induced breakdown is a known fatal defect of an SOI transistor.

Meanwhile, Eric P. Ver Ploeg et al. have proposed a dual source SOI transistor that can effectively eliminate a parasitic bipolar transistor effect (reference: "Elimination of Bipolar-induced Breakdown in Fully Depleted SOI MOSFETs," *IEDM '92*). FIG. 3 is a sectional view of an n-channel dual source SOI transistor.

Referring to FIG. 3, a double-structured source region consisting of a $n^+$ drain region 60, a channel region 62, a $n^+$ silicon layer 58a and a $p^+$ silicon layer 58b is formed on the thin silicon layer by interposing a buried insulating layer 52 on a silicon substrate 50. The $p^+$ silicon layer 58b in the source region collects holes generated around drain region 60 by impact ionization. Accordingly, the holes are not accumulated in channel region 62, thereby eliminating the bipolar-induced breakdown.

However, the above-mentioned method has problems. First, the SOI transistor used in a highly integrated circuit has to have a reduced thickness of the silicon layer formed on buried insulating layer 52 in order to improve a short channel effect. However, it is very difficult to form the $n^+$ and $p^+$ silicon layers 58a and 58b on such a thin silicon layer, and parasitic capacitance increases by the formation of these layers. The parasitic resistance also increases if the doping density of the $n^+$ silicon layer 58a is lowered. Moreover, a junction breakdown between $n^+$ silicon layer 58a and $p^+$ silicon layer 58b can be generated.

SUMMARY OF THE INVENTION

Accordingly, it is an object of the present invention to provide an SOI transistor to solve the above-mentioned problems.

To accomplish the above object, there is provided an SOI transistor having a silicon layer including first and second impurity regions and a channel region of a transistor by interposing an insulating layer on a semiconductor substrate, wherein the first impurity region of the transistor consists of at least two different semiconductor materials.

According to an embodiment of the present invention, the semiconductor materials constituting the first impurity region are made up of materials having different energy band gaps. It is preferable that at least one of the semiconductor materials constituting the first impurity region be $Si_{1-x}Ge_x$.

The second impurity region of the transistor may also be made up of at least two semiconductor materials having different types, similar to the first impurity region.

In addition, to accomplish the above object, there is provided an SOI transistor having a silicon layer including first and second impurity regions and a channel region of a transistor by interposing an insulating layer on a semiconductor substrate, wherein the first impurity region of the transistor is made up of $Si_{1-x}Ge_x$.

In the present invention, a heterostructure is employed in one or both sides (the source and/or drain region) of an SOI transistor, thereby preventing a bipolar-induced breakdown.

BRIEF DESCRIPTION OF THE DRAWINGS

The above objects and other advantages of the present invention will become more apparent by describing in detail the preferred embodiments thereof with reference to the attached drawings in which.

DETAILED DESCRIPTION OF THE INVENTION

Figure 4A:
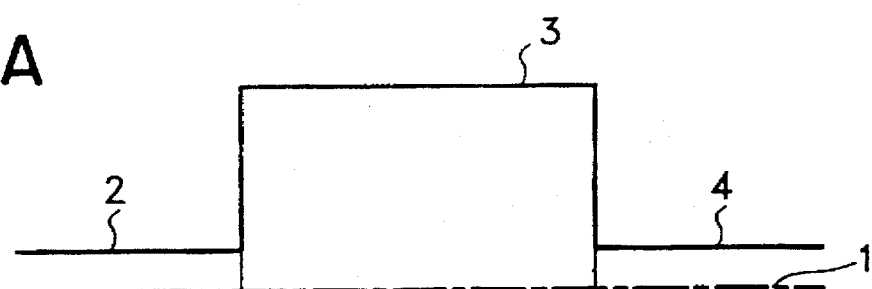
FIGS. 4A and 4B illustrate energy bands for explanation of a principle of the present invention.
Figure 4B:
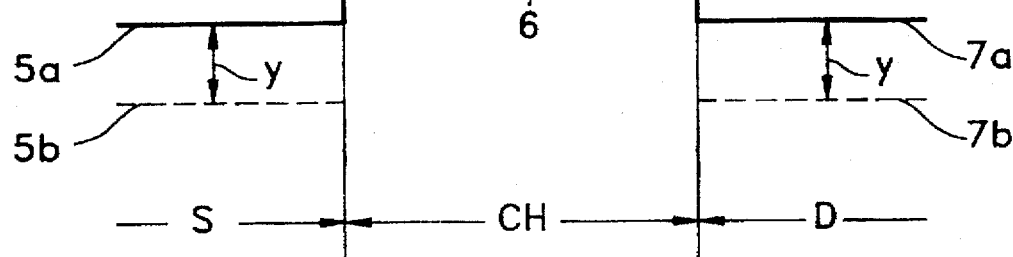

FIGS. 4A and 4B illustrate energy bands for explanation of a principle of the present invention. Here, S is a source region, CH is a channel region, D is a drain region, and 1 indicates a Fermi level. Reference numerals 2, 3 and 4 denote conduction bands of source, channel and drain, respectively. Reference numeral 5a denotes a first valence band of the source, 5b denotes a second valence band of the source, and 6 denotes a valence band of the channel. Reference numeral 7a denotes a first valence band of the drain and 7b denotes a second valence band of the drain.

Referring to FIGS. 4A and 4B, second valence bands 5b and 7b of source region S and drain region D are respectively reduced by an amount "y" by employing different semiconductor materials, to thereby produce first and second valence bands. Accordingly, the height of the source and drain electric potential barrier is reduced by "y" and thus holes are easily introduced into source region S or drain region D. In other words, holes generated by a strong electric field at an interfacial surface of channel region CH and drain region D are introduced into the channel region, and absorbed into a source region S (or drain region D) according to an electric field of channel region CH. As a result, an accumulation of holes in channel region CH is reduced, and a bipolar-induced breakdown caused by a hole current is prevented.

Figure 5:
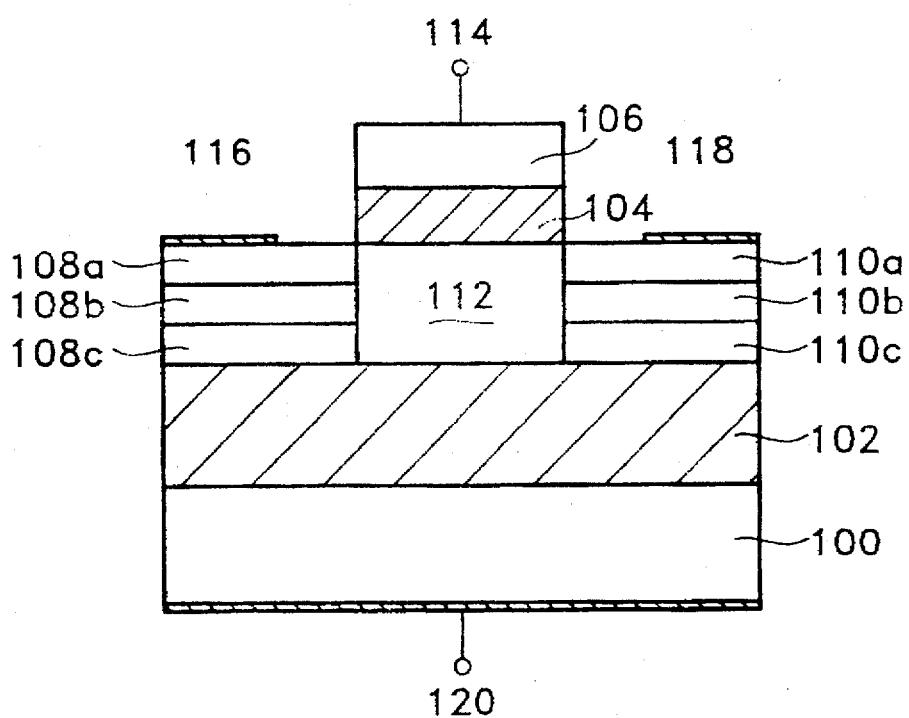
FIG. 5 is a sectional view showing an SOI transistor of embodiment 1 of the present invention.

FIG. 5 is a sectional view of a SOI transistor of embodiment 1 of the present invention.

Referring to FIG. 5, an SOI wafer consisting of a silicon substrate 100, a buried insulating layer 102 and a silicon layer is manufactured by conventional methods such as a zone-melting and recrystallization (ZMR), separation by implanted oxygen (SIMOX), or wafer bonding. Here, buried insulating layer 102 is formed of an insulating material, for example, oxide. Preferably, the thickness thereof is approximately 3,500 Å. It is more preferable that the silicon layer has a thickness of 1,000 Å. Then, the silicon layer is etched to a predetermined depth by a dry etching method, to thereby leave a first silicon region having a thickness of 200 Å. Then, an $Si_{1-x}Ge_x$ region and a second silicon region having thicknesses of 100 Å and 700 Å, respectively, are sequentially formed on the first silicon region by a conventional method, for example, molecular beam epitaxy (MBE) or chemical vapor deposition (CVD). Here, the thickness of the $Si_{1-x}Ge_x$ region is determined by a maximum threshold thickness. That is, if x is 0.4, the thickness has to be below 200 Å (reference: "Physics and Applications of $Ge_{x-1}Si_{1-x}$/Si Strained Layer Heterostructures," IEEE Journal of Quantum Electronics, Vol. QE-22, No. 9, pp. 1696–1710, September, 1986).

Then, the second silicon region, the $Si_{1-x}Ge_x$ region and the first silicon region corresponding to the portion where a channel is to be formed are removed by a dry etching method. At this time, only the first silicon region may remain. Then, a silicon film is deposited on the resultant structure by a CVD method and etched back. As a result, only the region where a channel is to be formed is filled with the silicon film, to thereby form a channel region 112.

Then, a thermal oxidation is performed on the resultant structure where channel region 112 is formed, to thereby form gate insulating film 104 to a thickness of approximately 100 Å. Then, a conductive material, for example, an impurity-doped polysilicon, is deposited to a thickness of 3,000 Å on gate insulating film 104. Then, the resultant structure is patterned by a lithography process, to thereby form a gate 106. Next, an n⁺ type impurity is injected, using gate 106 as a mask on the SOI wafer where channel region 112 is formed. As a result, a source region made up of a heterostructure of a first silicon region 108c, $Si_{1-x}Ge_x$ region 108b and second silicon region 108a and a drain region made up of a heterostructure of first silicon region 110c, $Si_{1-x}Ge_x$ region 110b and second silicon region 110a are formed.

The SOI transistor formed by the embodiment 1 operates as follows.

First, predetermined voltages are applied to gate electrode 114, source electrode 116, drain electrode 118 and substrate electrode 120, such that the drain voltage is higher than the source voltage. Accordingly, a current flows via source electrode 116, channel region 112 and toward drain electrode 118. In addition, a strong electric field is generated at an interfacial surface between source regions 108a, 108b and 108c and channel region 112 or between drain regions 110a, 110b and 110c and channel region 112. Here, since the height of the source and drain electric potential barrier is reduced by 0.74x due to $Si_{1-x}Ge_x$ region 108b of the source or $Si_{1-x}Ge_x$ region 110b of the drain, the holes generated by the strong electric field are absorbed into $Si_{1-x}Ge_x$ region 108b of the source or $Si_{1-x}Ge_x$ region 110b of the drain. Accordingly, a bipolar-induced breakdown does not occur since holes are not accumulated into channel region 112.

Figure 6:
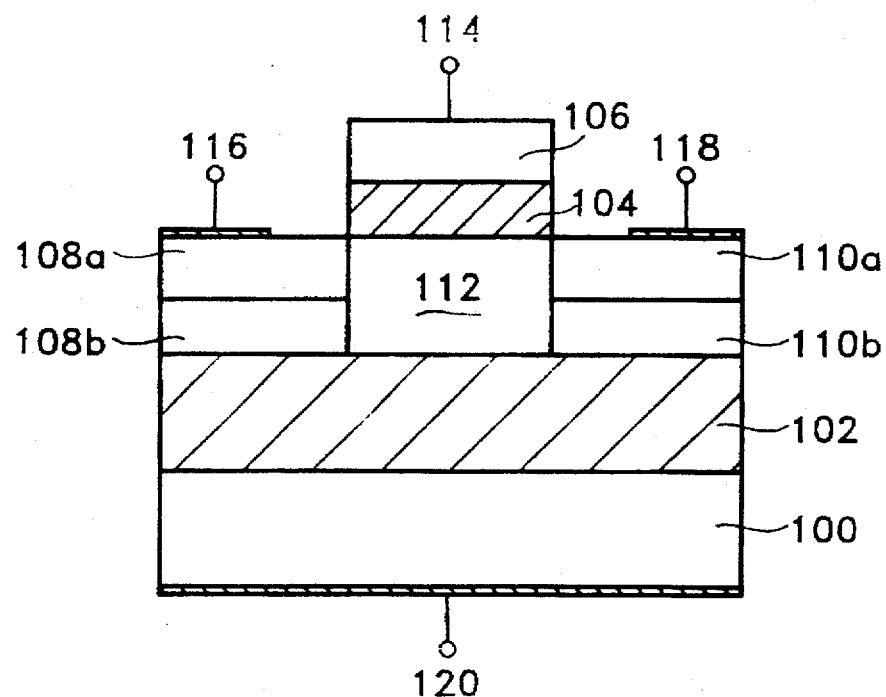
FIG. 6 is a sectional view showing an SOI transistor of embodiment 2 of the present invention.

FIG. 6 is a sectional view of a SOI transistor of embodiment 2 of the present invention.

Referring to FIG. 6, an SOI wafer consisting of silicon substrate 100, buried insulating layer 102 and a silicon layer is manufactured by the same method as that of embodiment 1. Then, $Si_{1-x}Ge_x$ regions 108b and 110b and silicon regions 108a and 110a are formed to thicknesses of 200 Å and 800 Å, respectively, on the SOI wafer by a conventional MBE or CVD method. Then, the $Si_{1-x}Ge_x$ region and silicon region corresponding to the portion where a channel is to be formed by a dry etching process are removed, and silicon is CVD-deposited on the portion where the channel is to be formed. As a result, only the portion where the channel is to be formed is filled with silicon, thereby forming channel region 112. Thereafter, gate, source and drain regions are formed by using the same method as that of embodiment 1.

In the SOI transistor manufactured by embodiment 2, holes generated by a strong electric field are absorbed into $Si_{1-x}Ge_x$ region 108b of the source or $Si_{1-x}Ge_x$ region 110b of the drain, similar to embodiment 1.

Figure 7:
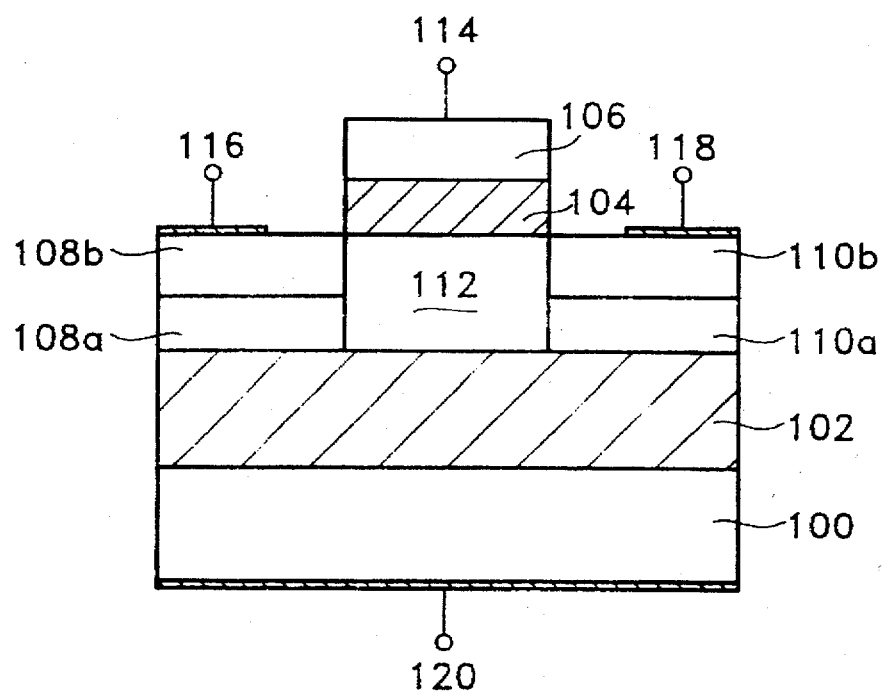
FIG. 7 is a sectional view showing an SOI transistor of embodiment 3 of the present invention.

FIG. 7 is a sectional view of a SOI transistor of embodiment 3 of the present invention.

Referring to FIG. 7, silicon regions 108a and 110a are formed to thicknesses of 200 Å and 800 Å, respectively, on the $Si_{1-x}Ge_x$ regions 108b and 110b of embodiment 2, while $Si_{1-x}Ge_x$ regions 108b and 110b are formed to thicknesses of 800 Å and 200 Å, respectively, on the silicon regions 108a and 110a of embodiment 3. Then, channel, gate, source and drain regions are formed by the same method as that of embodiment 2.

Figure 8:
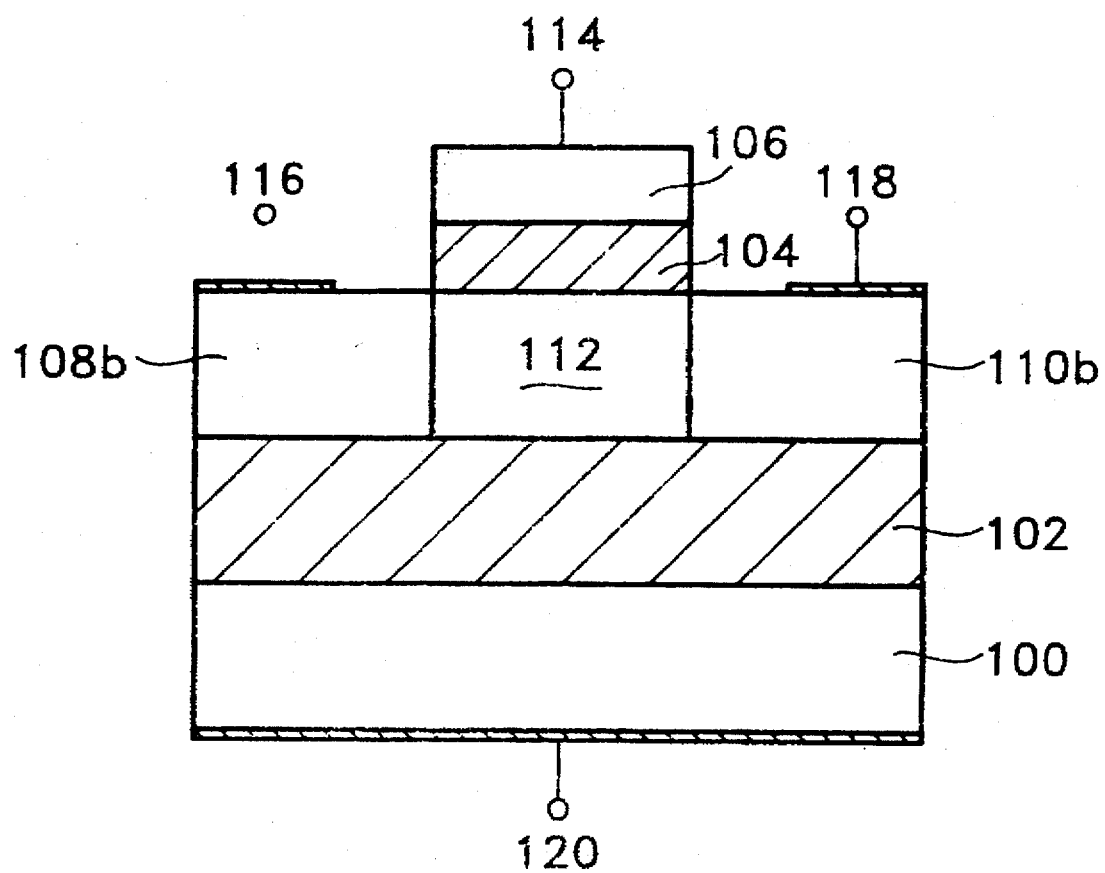
FIG. 8 is a sectional view showing an SOI transistor of embodiment 4 of the present invention.

FIG. 8 is a sectional view of SOI transistor of embodiment 4 of the present invention.

Referring to FIG. 8, an SOI wafer is formed by the same method as that of embodiment 1, and gate 104 is formed thereon. Then, germanium (Ge) is ion-implanted on the silicon layer of an SOI wafer by using gate 104 as a mask, to thereby form a single layer consisting of $Si_{1-x}Ge_x$ regions 108b and 110b. Sequentially, an $n^+$ impurity is ion-implanted to form a source and a drain region.

According to the SOI transistor formed by embodiment 4, holes generated at the interfacial surface between source region 108b and channel region 112 or between drain region 110b and channel region 112 are not accumulated into channel region 112, but absorbed into source region 108b or drain region 110b.

Though both the source region and drain region of an SOI transistor have heterostructures respectively as shown in embodiment 1 to embodiment 4, only one of either the source region or drain region may have a heterostructure.

According to the present invention, a heterostructure is employed for one or both of the source/drain regions. Thus, a channel region does not accumulate holes which are generated by a strong electric field at an interfacial surface between the channel region and source region or between the channel region and drain region, to thereby prevent a bipolar-induced breakdown.

Figure 1:
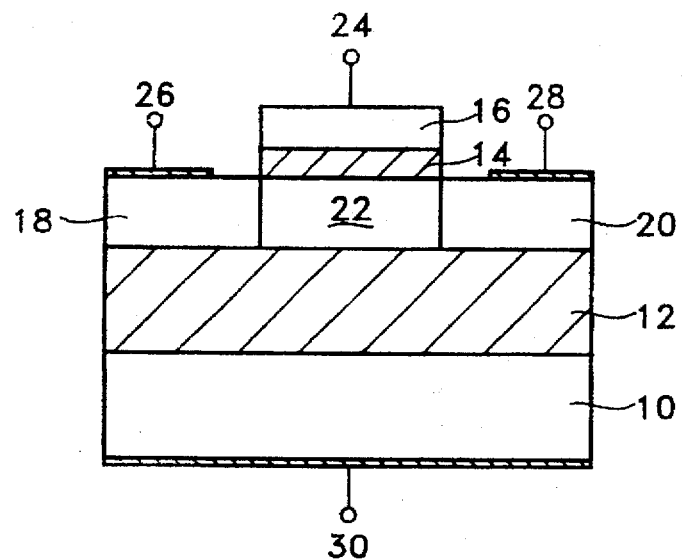
FIG. 1 is a sectional view of an SOI transistor manufactured by a conventional method.
Figure 2:
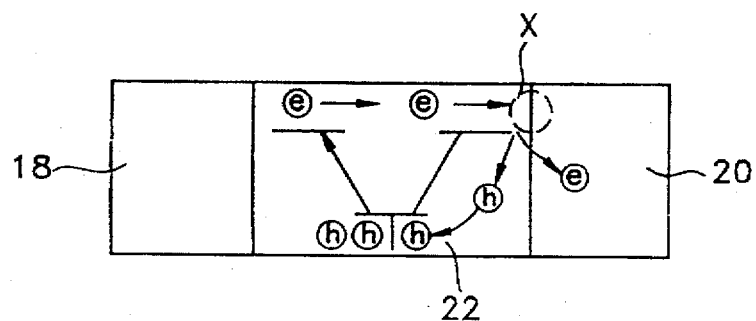
FIG. 2 is a schematic view showing the source, channel and drain regions shown in FIG. 1.
Figure 3:
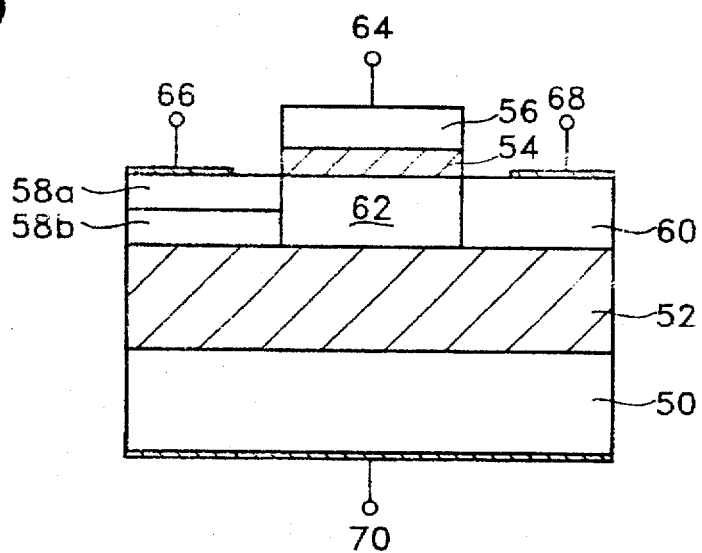
FIG. 3 is a sectional view showing the SOI transistor proposed by Eric P. Ver Ploeg et al.

In addition, the silicon region and $Si_{1-x}Ge_x$ region can be formed by an MBE or CVD method, which allows easy control of the thickness thereof. Thus, the conventional problems explained with regard to FIG. 3 can be solved. Moreover, problems such as increased parasitic capacitance and the parasitic resistance and junction breakdown occurring in the conventional method explained with reference to FIG. 3 can be solved since the silicon region and $Si_{1-x}Ge_x$ region are doped with the same conduction type impurity.

It is understood by those skilled in the art that the foregoing description is a preferred embodiment of the present invention and that various changes and modifications may be made in the invention without departing from the spirit and scope thereof.

What is claimed is:

1. A silicon-on-insulator (SOI) transistor comprising:

a semiconductor substrate;

an insulating layer formed on said substrate;

a channel region comprised of a single layer of a first semiconductor material formed on said insulating layer, said first semiconductor material being Si; and first and second impurity regions respectively disposed on opposite sides of, and abutting with, said channel region, at least one of said first and second impurity regions being comprised of a heterostructure of at least two layers of second and third semiconductor materials successively formed on said insulating layer, said second and third semiconductor materials being Si and $Si_{1-x}Ge_x$, respectively and having different energy band gaps, said heterostructure being formed of a first layer of Si, a second layer of $Si_{1-x}Ge_x$ formed on said first layer, and a third layer of Si formed on said second layer.

2. A SOI transistor according to claim 1, wherein both said first and second impurity regions are comprised of said heterostructure.

* * * * *